(12) United States Patent
Clemen, Jr.

(10) Patent No.: US 9,532,463 B2
(45) Date of Patent: Dec. 27, 2016

(54) METHODS AND APPARATUS FOR REDUCING THE OCCURRENCE OF METAL WHISKERS

(71) Applicant: THE BOEING COMPANY, Chicago, IL (US)

(72) Inventor: Mark J. Clemen, Jr., Bremerton, WA (US)

(73) Assignee: THE BOEING COMPANY, Chicago, IL (US)

( * ) Notice: Subject to any disclaimer, the term of this patent is extended or adjusted under 35 U.S.C. 154(b) by 1087 days.

(21) Appl. No.: 13/656,293

(22) Filed: Oct. 19, 2012

(65) Prior Publication Data

US 2014/0110402 A1    Apr. 24, 2014

(51) Int. Cl.
   *H05K 3/22* (2006.01)
   *C25D 5/48* (2006.01)
   *H05K 1/02* (2006.01)

(52) U.S. Cl.
   CPC ........ *H05K 3/22* (2013.01); *C25D 5/48* (2013.01); *H05K 1/0212* (2013.01); *H05K 2201/0769* (2013.01); *H05K 2201/10121* (2013.01); *H05K 2201/10219* (2013.01); *H05K 2203/102* (2013.01); *H05K 2203/107* (2013.01)

(58) Field of Classification Search
   CPC combination set(s) only.
   See application file for complete search history.

(56) References Cited

U.S. PATENT DOCUMENTS

| 7,498,593 | B2 * | 3/2009 | Shen | H01Q 3/2676 250/330 |
| 8,283,619 | B2 * | 10/2012 | Novack | H01Q 1/248 250/208.2 |
| 2007/0275262 | A1 | 11/2007 | Lin et al. | |
| 2008/0071403 | A1 * | 3/2008 | Conway | C30B 13/24 700/97 |
| 2009/0068474 | A1 * | 3/2009 | Lower | C09D 1/02 428/433 |
| 2010/0220750 | A1 * | 9/2010 | Brownell | H01S 1/005 372/4 |

FOREIGN PATENT DOCUMENTS

| JP | 2006291276 A | 10/2006 |
| JP | 2008280559 A | 11/2008 |

OTHER PUBLICATIONS

Integrated Horn Antennas for Terahertz Applications, Eleftheriades, Ali-Ahmad, Katehi, Rebeiz, Symposim of Space Terahertz Technology, 1991.*
Integrated Horn Antennas for Terahertz Applications, Eleftheriades, Ali-Ahmed, Katehi, Rebeiz, Symposium of Space Terahertz Technology. 1191.*

(Continued)

*Primary Examiner* — Dana Ross
*Assistant Examiner* — Renee LaRose
(74) *Attorney, Agent, or Firm* — Vista IP Law Group LLP; Cynthia A. Dixon (57) ABSTRACT

Methods and apparatus for reducing the occurrence of metal whiskers on surfaces are disclosed herein. In particular, the present disclosure teaches providing at least one source of electromagnetic energy to emit energy to reduce the occurrence of metal whiskers on a surface.

20 Claims, 9 Drawing Sheets

(56) References Cited

OTHER PUBLICATIONS

International Search Report, Application Ser. No. PCT/US2013/057489, Jan. 21, 2014.
Fukuda, et al., "The Effect of Annealing on Tin Whisker Growth", IEEE Transactions of Electronics Packaging Manufacturing, IEEE, Piscataway, NY, US, vol. 29, No. 4, pp. 252-258, Oct. 1, 2006.
Brusse, et al., "Tin Whiskers: Attributes and Mitigation", Carts Europe 2002: 16th Passive Components Symposium, 2002.
Lee, "Spontaneous Growth Mechanism of Tin Whiskers", School of Materials Science and Engineering, Seoul National University.
Leidecker, et al., "Metal Whiskering: Tin, Zinc, and Cadium", GSFC/NASA, Apr. 2007.
Dittes, et al., "Tin Whisker Formation—Results, Test Methods and Countermeasures", Infineon Technologies, Philips CFT, STMicroelectronics.
Panashchenko, "Evaluation of Environmental Tests for Tin Whisker Assessment", Thesis submitted to the Faculty of the Graduate School of University of Maryland, College Park, 2009.
Panashchenko, et al., "Examination of Nickel Underlayer as a Tin Whisker Mitigator", originally presented at IEEE ECTC Conference, San Diego, California, May 2009, modified for Tin Whisker Teleconference, Sep. 30, 2009.

* cited by examiner

$$\text{time} = \frac{\text{MeltEnergy}}{P_w} = \frac{[(T_m - 273)\, C_h + C_f]\, P_m P_r}{P_0 Z_0 G}$$

METHODS AND APPARATUS FOR REDUCING THE OCCURRENCE OF METAL WHISKERS

FIELD

The invention is directed to methods and apparatus for reducing the occurrence of metal whiskers on a surface.

BACKGROUND

Figure 1:
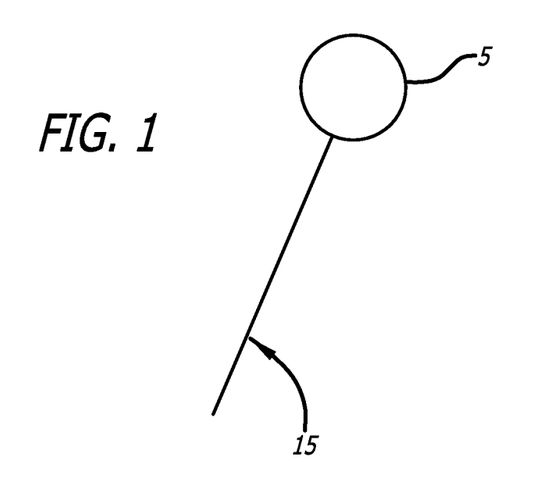
FIG. 1 shows an illustration of a metal whisker.
Figure 2A:
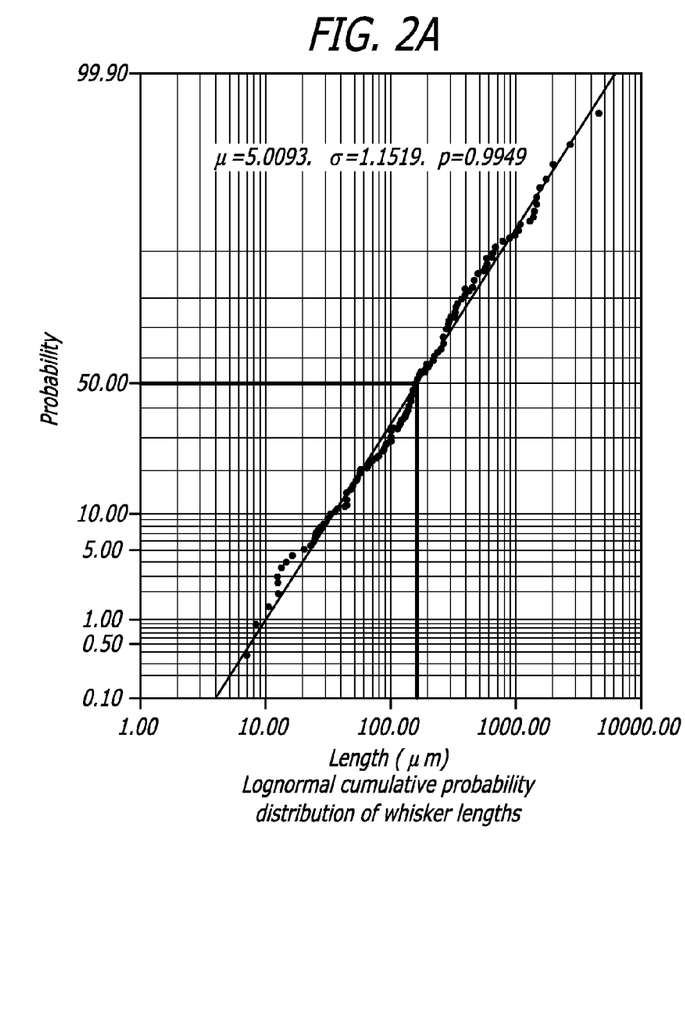
FIGS. 2A and 2B show a graphical illustration of data reflecting the occurrence of typical metal whiskers in a sample.
Figure 2B:
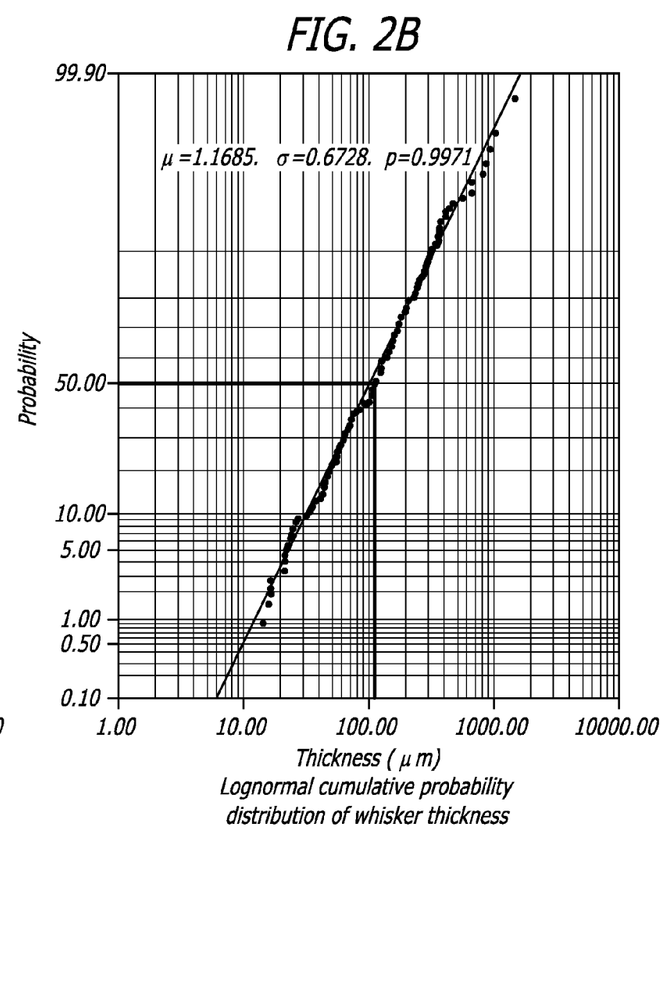

In the past, electronic solder included lead, which was beneficial in maintaining substantial material and electrical stability of solder joints and promoting long-term reliability of such joints. Because of toxic properties of lead, its industrial use has decreased in recent years, and tin has become a common replacement of lead in solder. However, tin is a "whiskering" metal that has a tendency to form undesirable "whiskers" or strands between electrical components. For example, FIG. 1 shows a wire 5, where a metal whisker 15 is extending from the wire 5. FIGS. 2A and 2B feature graphical representations of example data illustrating whisker occurrence on a sample. (Source: Panashchenko, L., *Evaluation of Environmental Tests for Tin Whisker Assessment*, p. 86, FIGS. 59 and 60). In particular, data for whisker length and thickness for 187 whiskers at random locations throughout an eleven year-old sample of tin-plated brass were collected. As the illustrations show, occurrences of tin whiskers with varying thickness (FIG. 2B) and lengths (FIG. 2A) could be found throughout the sample.

SUMMARY

Accordingly, it would be desirable to provide methods and apparatus for exposing electronic components with solder joints containing tin and/or whiskering metals to a non-contact means of mitigating or removing such whiskers, here provided by sufficient electromagnetic energy to reduce the occurrence of whiskering in the solder joints, thus improving reliability of the electronic components. The present disclosure relates to methods, systems, and apparatus for reducing the occurrence of metal whiskers on a metal surface. In one or more embodiments, the present disclosure teaches a method of reducing the formation of metal whiskers on a surface having whiskering metal. The exemplary method comprises emitting electromagnetic energy from at least one electromagnetic energy source via a radiation field in which the whiskering metal is positioned, and controlling parameters for emitting electromagnetic energy from the at least one electromagnetic energy source. Such parameters may include frequency, amplitude, and power level of electromagnetic energy, as well as the duration of its emission. The electromagnetic field induces alternating electric field and current at the whisker driving disrupting energy directly into the forming whisker. In one embodiment, the at least one electromagnetic energy source comprises a terahertz emitter.

In one or more embodiments, the present disclosure teaches an apparatus for applying energy to a circuit board housing. The exemplary apparatus comprises at least one electromagnetic energy source positioned to provide electromagnetic energy to the circuit board housing, and a controller for controlling, e.g., the duration, frequency, power level, and amplitude of the electromagnetic energy emitted from the at least one electromagnetic energy source, wherein the circuit board housing is configured to contain electronic components having a whiskering metal. In one embodiment, the at least one electromagnetic energy source comprises multiple electromagnetic energy sources coupled to circuit board cards associated with the circuit board housing.

The features, functions, and advantages can be achieved independently in various embodiments of the present invention or may be combined in yet other embodiments.

DRAWINGS

These and other features, aspects, and advantages of the present disclosure will become better understood with regard to the following description, appended claims, and accompanying drawings where:

DESCRIPTION

The methods and apparatus disclosed herein reduce the occurrence of metal whiskers on metal surfaces, and in particular in electronic soldering joints in various applications.

To counteract the formation of metal whiskers on a surface of a solder joint, one or more sources of electromagnetic energy may direct electromagnetic energy to the solder joint, containing e.g. tin, to reduce the occurrence of whiskering in the solder joint. The electromagnetic field may be of an amplitude large enough to disrupt the physical and chemical drivers that lead to whisker growth, and even to decrease the whisker length itself by means of tip melting via resonant energy transfer to the whisker. In particular, the one or more sources of electromagnetic energy is configured to create a radiation field in which the whiskering metal is positioned. The energy is emitted according to controlled parameters, which may include duration of energy exposure, energy level, and the frequency of the emitted energy.

In the following description, numerous details are set forth in order to provide a more thorough description of the various aspects of the disclosure. However, those skilled in the art will appreciate that one or more aspects of the disclosure may be practiced without these specific details. In the other instances, well-known features have not been described in detail so as not to unnecessarily obscure the disclosure.

The invention, in one or more aspects thereof, relates to methods and apparatus for exposing electronic components containing tin or other whiskering metals in solder joints to electromagnetic energy that reduces the occurrence of whiskering in the solder joints, wherein the exposure occurs based on specified parameters.

To counteract the occurrence of metal whiskers, one or more sources of electromagnetic energy may be used to emit electromagnetic energy in a volume containing electronic components with solder joints having the whiskering metal. Of note, while whiskering metals include tin, zinc, cadmium, gold, and others to varying degrees, as well as alloys of the aforementioned materials, the specification will refer primarily herein to tin as the whiskering metal for purposes of illustration only.

Figure 3:
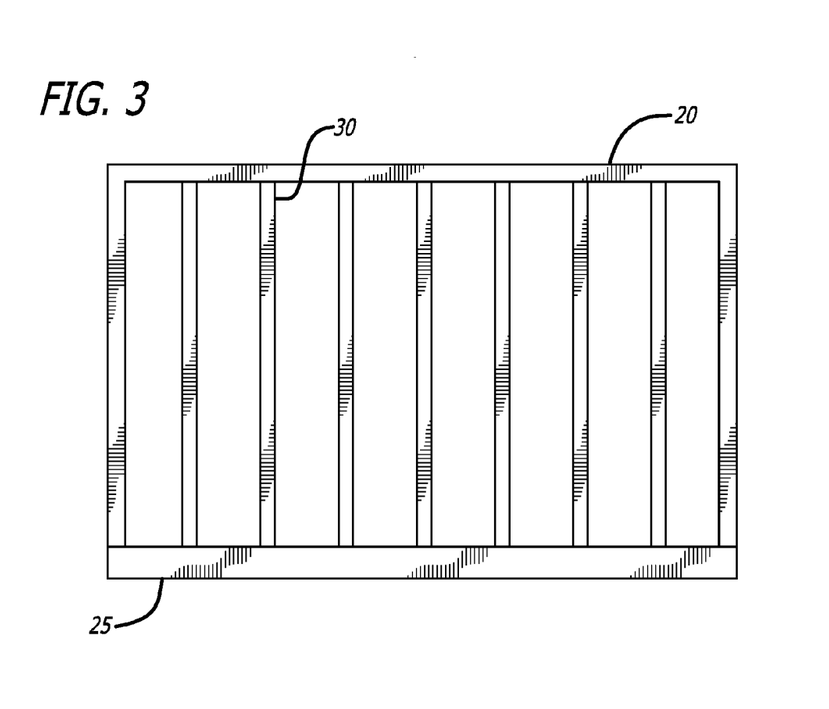
FIG. 3 shows a structure for housing electronic components.

To illustrate an application for electromagnetic energy emission, FIG. 3 illustrates a structural frame 20, which includes an electronic bus 25 and which houses a plurality of electronic assemblies, such as circuit board cards 30. Typically, circuit board cards have a number of electronic components having tin solder joints. Those skilled in the art will appreciate that tin whiskers may form on, around, or between the tin solder joints.

Figure 4:
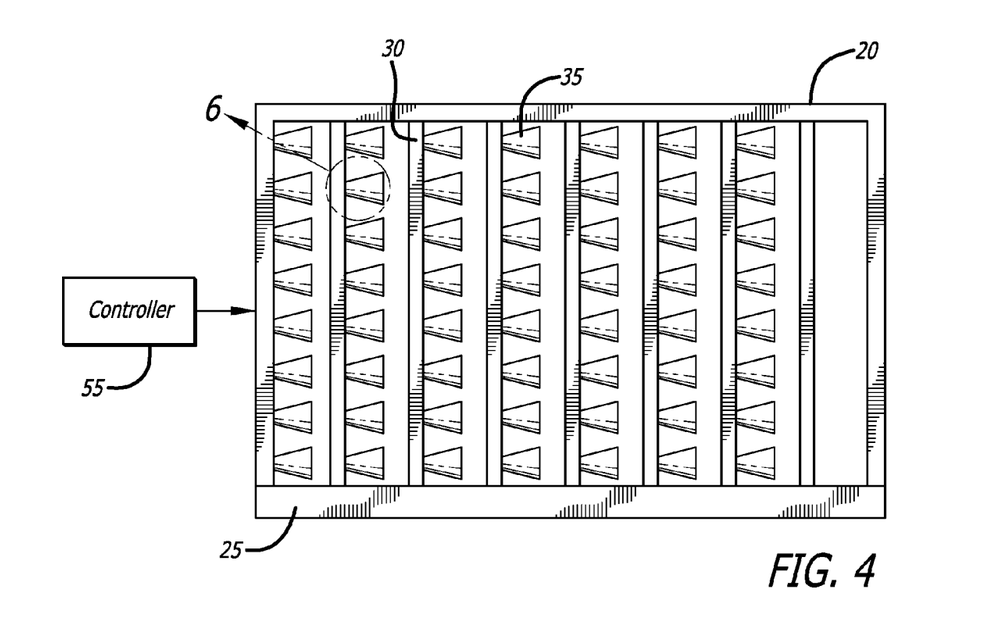
FIG. 4 shows the structure of FIG. 3 with a series of sources of electromagnetic energy.

To limit the occurrence of tin whiskers associated with the solder joints, a source of electromagnetic energy may be applied to the solder joints. Referring to FIG. 4, in the illustrated embodiment, an emitter of electromagnetic radiation, such as a terahertz (THz) emitter 35 is used to emit radiofrequency (RF) energy to which the solder joints are exposed. For example, millimeter-waves (mmWaves) and THz RF waves have electromagnetic wavelengths that cause resonance in whiskers of typical lengths found in tin solder (refer to FIG. 2A again). In alternative embodiments, infrared and ultraviolet emitters may be used depending on the scale of the budding whisker formation, and the specific absorption means of disrupting the chemical or physical processes driving whisker formation. When utilizing electromagnetic (EM) wavelengths, such as infrared, the interaction of the EM field with the metal surface within the characteristic skin depth causes disruption of the coherent stresses and chemical diffusion that result in whiskering. This disruption will be preferentially at the points of the nanostructures of nascent whiskers that are resonant with, e.g., the infrared EM wavelength. Such nascent whiskers may have lengths between, e.g., about 1 micron and 100 microns. Beneficially, the parameters of RF energy emission can be controlled to help optimize performance in reducing the occurrence of tin whiskers in the various stages of development on the solder joints. Mature (i.e. larger) whiskers will be mitigated by lower frequency EM energy, such as millimeter waves and THz RF waves, and the method benefits from the electric field enhancements at the tips of such structures. Immature (i.e. smaller) whiskers will be mitigated by higher frequency EM energy, such as infrared, optical, and ultraviolet frequencies. The mitigation is in the form of very localized surface heating, sufficient to overcome driving internal stresses, and in the form of disruption of coherent electrical potential basis present in the material.

Figure 5:
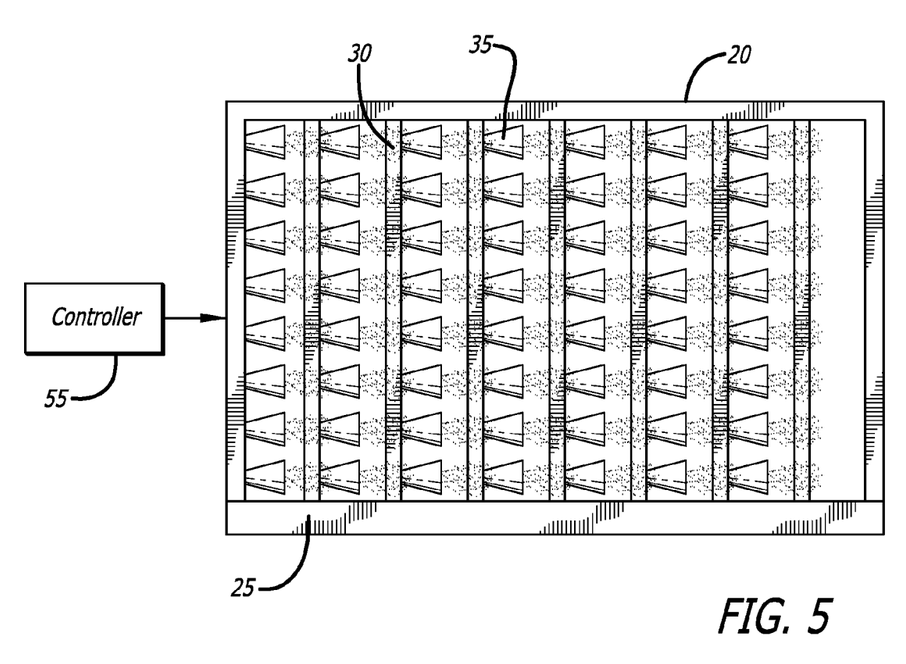
FIG. 5 shows the series of sources of electromagnetic energy in FIG. 3 emitting electromagnetic energy.

FIG. 4 shows the structural frame 20 with multiple terahertz (THz) emitters 35 coupled to each of the circuit board cards 30. While FIG. 4 shows multiple terahertz (THz) emitters 35 coupled to each card 30, in other embodiments, each card 30 may only have one emitter 35 coupled to the card 30. In another embodiment, only one or more selected cards 30, instead of all of the cards, may have one or more emitters 35 coupled to each card 30. These cards may be part of a stand-alone apparatus to "clean" electronics from whiskers. Such an apparatus may be built into a stand-alone housing that provides a short-duration "de-whiskering" function, or alternatively, it may be built into an otherwise-standard card-bus housing. In another variant, at least one card may each include at least one emitter 35 in parallel to the primary functions of these electronic circuit cards, for the purpose of a long duration "de-whiskering" of the cards themselves and/or the neighboring electronic cards. The emitters emit RF energy at specified parameters that will be explained in further detail below. The emitters 35 are positioned on the card 30 to emit RF energy toward an adjacent card 30. FIG. 5 provides an example illustration of the emitters 35 emitting RF energy to adjacent circuit board cards 30.

Figure 6:
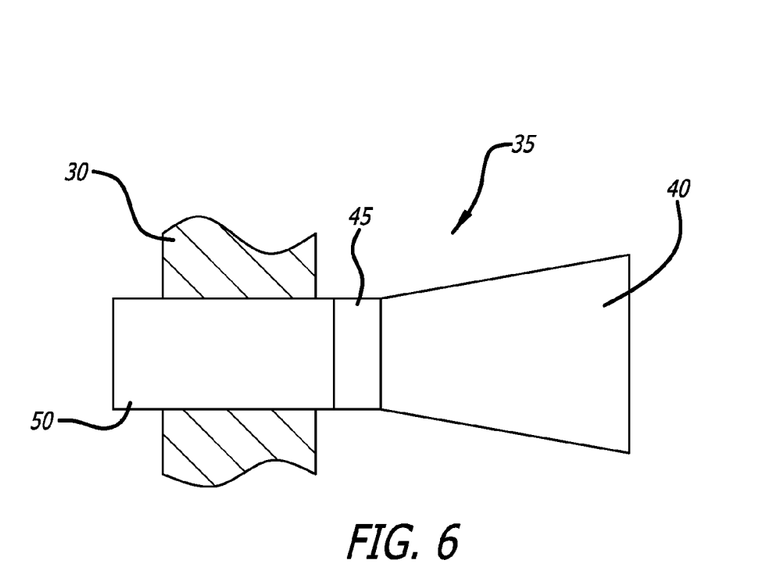
FIG. 6 shows further details of a source of electromagnetic energy from FIG. 5.

Referring to FIG. 6, the structure of the THz emitter 35 is shown. In the illustrated embodiment, the emitter 35 features a horn or pyramid antenna 40 for the emission of RF energy. Other structures, such as cylindrical antennas, may also be contemplated. To provide the RF energy, the emitter 35 may include a quantum cascade laser (QCL) 45 for creating THz radiation at low temperatures in a space environment, or in a highly cooled application. Of course, other types of apparatus known in the art for creating THz radiation may also be contemplated. The emitter 35 additionally features a cooler 50, such as a Peltier cooler, to help regulate temperature control and ensure operating efficiency of the QCL 45. In other embodiments, other pulsed THz emitter devices may also be used that would be inherently broadband to resonate over a wide variety of whisker lengths. However, THz devices with inherently low energy may require high repetition rates of RF energy emission to achieve the necessary output power for metal whisker reduction.

Figure 7:
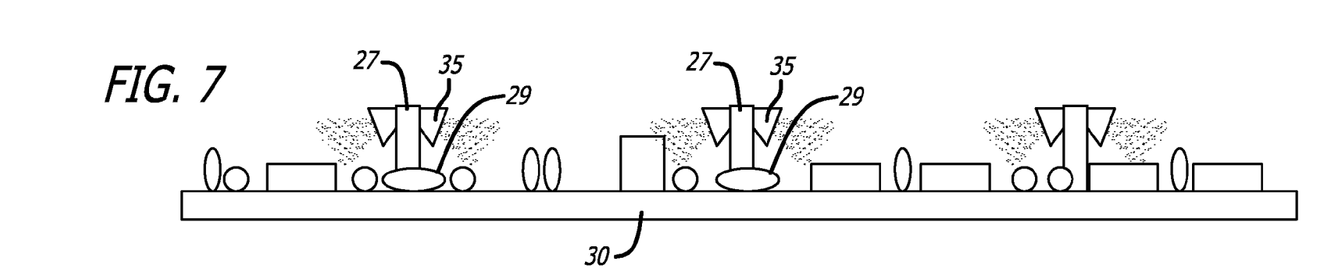
FIG. 7 shows the sources of electromagnetic energy of FIG. 6 emitting electromagnetic energy, where the sources are built into electronic components of a circuit board card.
Figure 8:
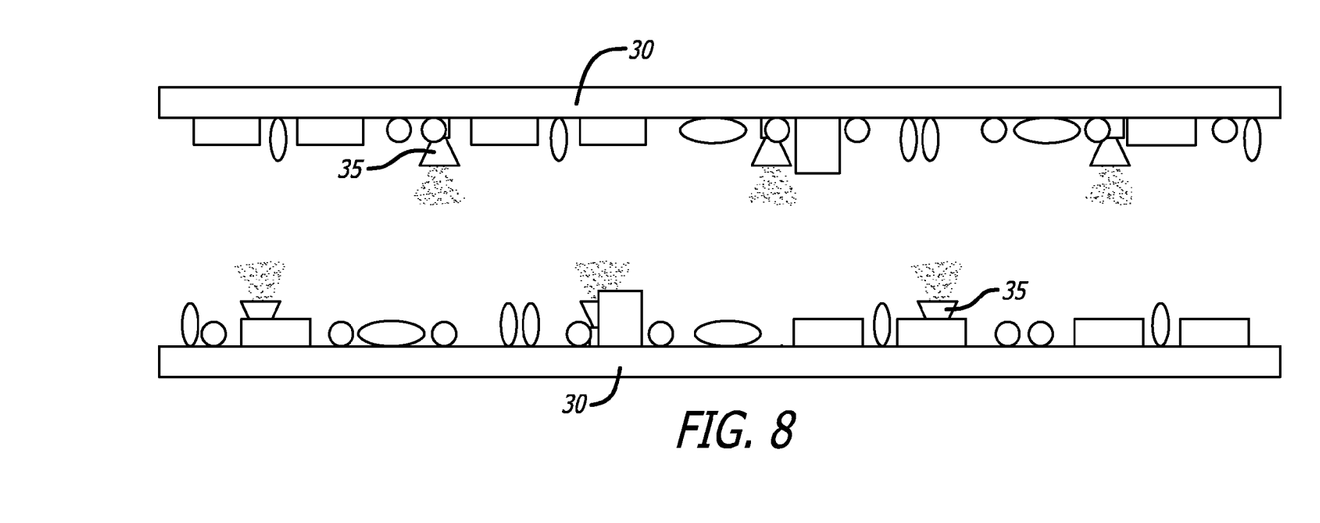
FIG. 8 shows the sources of electromagnetic energy of FIG. 6 emitting electromagnetic energy, where the sources are positioned on two circuit board cards.
Figure 9:
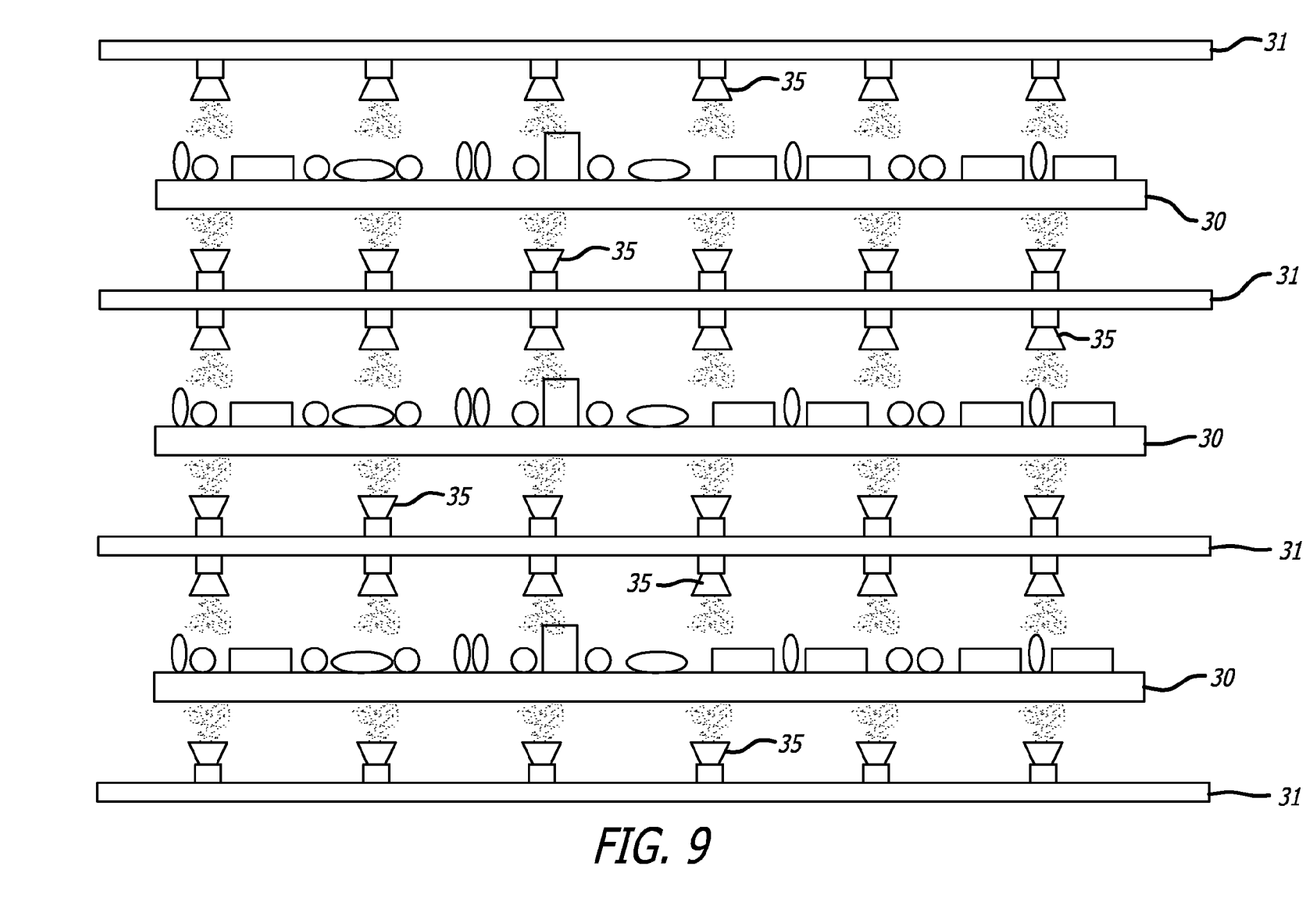
FIG. 9 shows the sources of electromagnetic energy of FIG. 6 emitting electromagnetic energy, where the sources are positioned on plates near the circuit board cards.

In the illustrated embodiment shown in FIG. 6, the emitter 35 is embedded within the circuit board card 30. In other embodiments, the emitter 35 may be positioned on a surface of the circuit board card 30 or in some other contact with the card 30. Alternatively, the emitter 35 may not be placed in contact with one of the circuit board cards 30, but rather is positioned near one or more of the cards 30 in a manner that still exposes the surrounding cards 30 to sufficient THz radiation (refer to, e.g., FIG. 8). In yet another embodiment, the emitters 35 may be built into the electronic components 27 having soldered connections 29 with the circuit board (refer to FIG. 7). The emitters are oriented to directly expose the target electronic components on the circuit board card 30 to the RF energy. In another embodiment, at least one board or plate 31 of emitters 35 is formed and positioned next to at least one circuit board card 30 (refer to FIG. 9).

Figure 10:
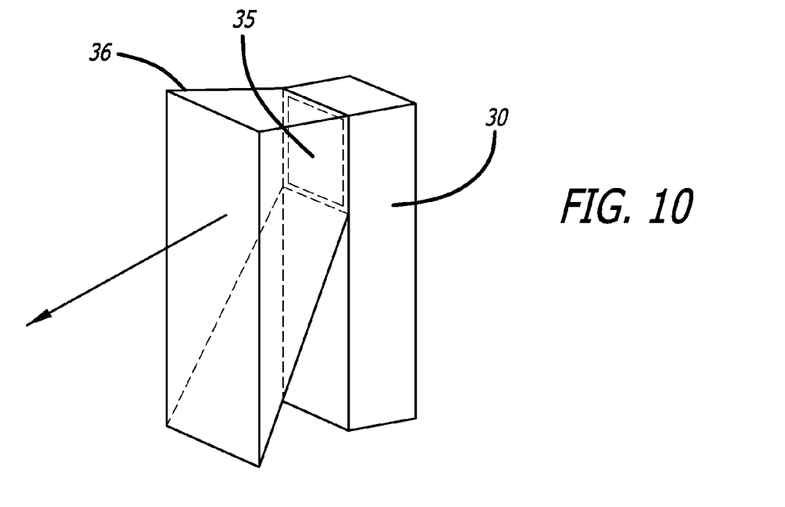
FIG. 10 shows a reflector configured as a horn surrounding the emitter of FIG. 6 and mounted on a circuit board.
Figure 11:
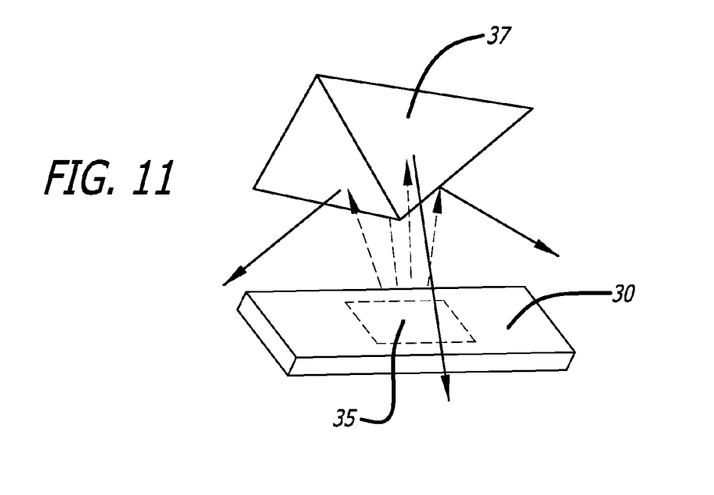
FIG. 11 shows a reflector disposed next to the emitter of FIG. 6, which is mounted on a circuit board.

In embodiments wherein the emitters 35 are embedded in or positioned near the target electronic components, a reflector 36 (see FIG. 10) may also be positioned near the emitters 35 to reflect the RF energy in a target direction to maximize exposure of the RF energy at the target site of electronic components. The reflector 36 may be any that is standard practice in the art to control the direction of RF or EM energy propagation. The exemplary reflector 36 may be configured as a horn, surrounding the emitter 35 and mounted on a circuit board 30, as in FIG. 10. As illustrated in FIG. 11, the reflector may be, e.g. a reflector 37, disposed next to the emitter 35, which is mounted on the circuit board 30. The reflector 37 directs the RF energy of the emitter 35 back at other components on the circuit board 30.

Figure 12:
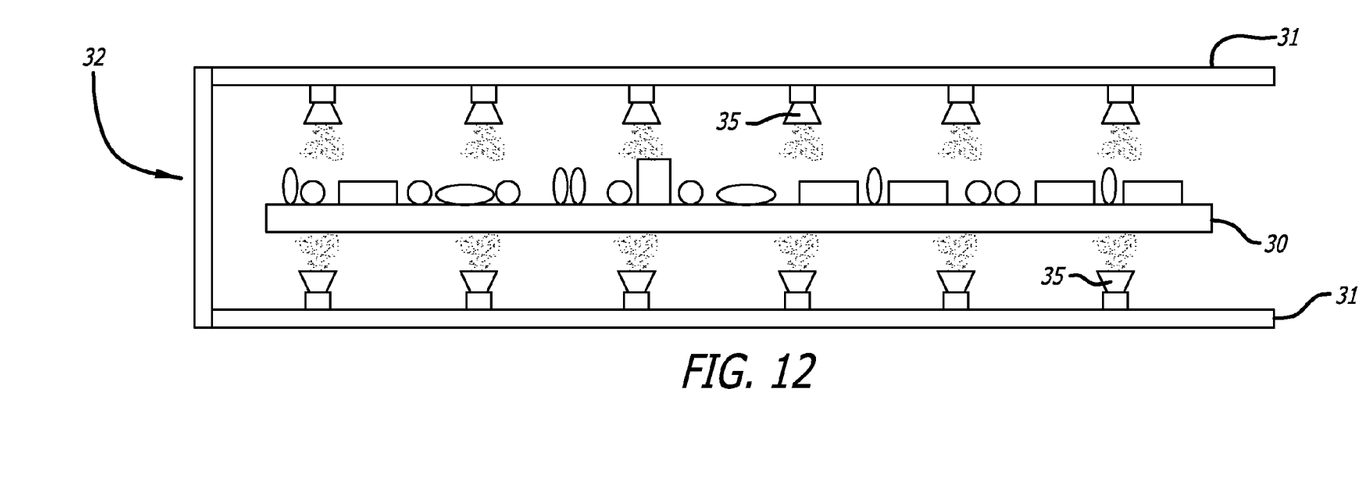
FIG. 12 shows the sources of electromagnetic energy of FIG. 6 emitting electromagnetic energy, where the sources are contained in a housing, and the circuit board card is removed from the housing after emission.
Figure 13:
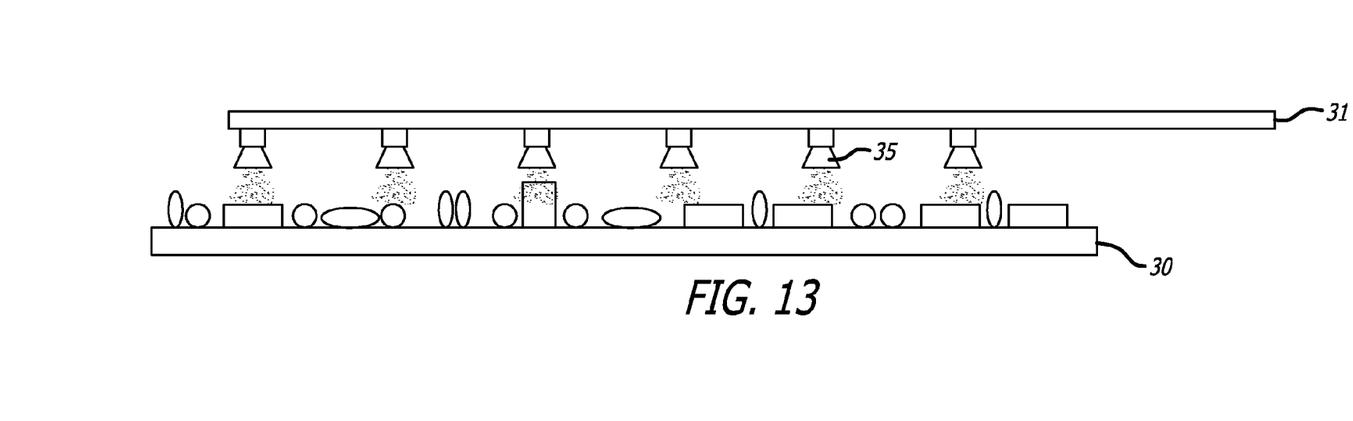
FIG. 13 shows the sources of electromagnetic energy of FIG. 6 emitting electromagnetic energy, where the sources are placed near a circuit board card and withdrawn after emission.

In another embodiment, rather than have the emitters 35 integrated with the target electronic components, one or more emitters 35 may be separate from the circuit board cards 30 or other target electronic components, wherein the emitter(s) 35 are placed near the cards 30 as desired and operated to emit RF energy (refer to FIG. 13). After the RF energy is emitted, the emitter(s) 35 is deactivated and/or withdrawn from the components. In yet another embodiment, a housing 32 containing one or more emitter(s) 35 is formed, wherein a structure of electronic components, such as at least one circuit board card 30, is placed as desired (refer to FIG. 12). Inside the housing 32, the emitter(s) 35 emit RF energy as needed, and when complete, the structure of electronic components is removed from the container 32.

Figure 14:
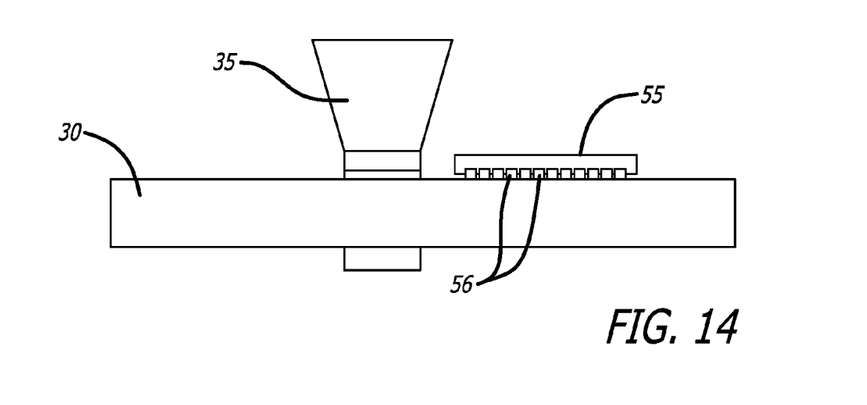
FIG. 14 shows the source of electromagnetic energy of FIG. 6 connected to a controller including pins, which are monitored for shorts with adjacent pins.

As mentioned previously, the RF energy may be generated by the emitters 35 according to specified parameters. To this end, as shown, e.g., in FIGS. 4 and 5, a controller 55 in electronic communication with the emitters 35 may be used to control operation of the emitters 35 based on parameters programmed in the controller 55. The controller 55 may be an embedded microcontroller with standard preloaded software, a timer, as well as analog and digital interfaces. An exemplary controller commonly used in the industry at this time is the MicroChip PIC series microcontroller, manufactured by Microchip Technology Inc., located in Chandler, Ariz. The controller 55 may operate on demand by an external switch, on a specified schedule, and/or when built-in circuit monitors indicate the likely presence of whiskering, such as built-in high impedance "trip-wires". In the circuit-monitoring mode, some of the closely-spaced programmable pins 56 of the controller 55 near the emitter 35 (as are often provided in the generic products, such as the PIC series) are monitored as part of the controller software program for indications of shorts with adjacent pins 56, also dedicated for the "trip-wire" purpose (refer to FIG. 14). The detection of such a short indicates the existence of significant whiskering conditions.

In addition, the controller may command the application of low power continuous electromagnetic radiation and/or high power burst power application. Depending upon the type of electromagnetic emitter chosen, and the potential needs for non-interference with the electronics application, the controller may specify the application of the electromagnetic energy starting at one wavelength, and then progressively sweeping in wavelength to another final wavelength; and may specify the application of the electromagnetic energy over a simultaneous band of wavelengths. Likewise, the controller may shift the nature of the electromagnetic energy applied. For example, early in a life of a circuit board mission, only short wavelengths may be applied (i.e. wavelengths causing resonance in any budding short whiskers), and later in the life of a circuit board mission, longer wavelengths may also be applied (i.e. wavelengths causing resonance in whiskers having excessive size).

In one embodiment, the RF energy is applied by the emitters 35 continuously and at a low power level. In another embodiment, the emitters 35 emit RF energy according to a schedule, such as on an hourly, daily, weekly, or monthly schedule. The regular application of RF energy by the emitters 35 helps to reduce the occurrence of the tin whiskers to help ensure the long-term reliability of a system otherwise susceptible to metal whiskering.

In addition, the emitters 35 may be configured to selectively apply RF energy as desired by a user. For example, the emitters 35 may be configured to emit RF energy only at the discretion of a user. In another embodiment, a user may operate the emitters 35 to emit RF energy to supplement scheduled emissions. As another parameter, the frequency of the RF energy may also be controlled. For example, the RF energy may be applied at a single frequency, a discrete set of frequencies, a continuous band of frequencies simultaneously, or it may be applied in a swept band of frequencies. To provide some examples for operation, the emitters 35 may emit RF energy once a month at about one watt of THz power per square centimeter of area covered, or every eight hours at about 0.01 watt of THz power per square centimeter.

Figure 15:
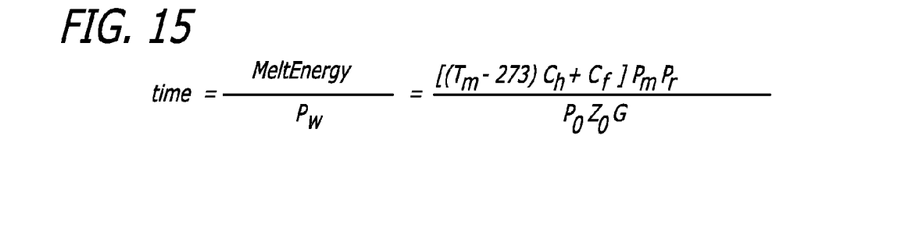
FIG. 15 shows an equation for calculating a characteristic processing time for tin metal whiskers.
Figure 16:
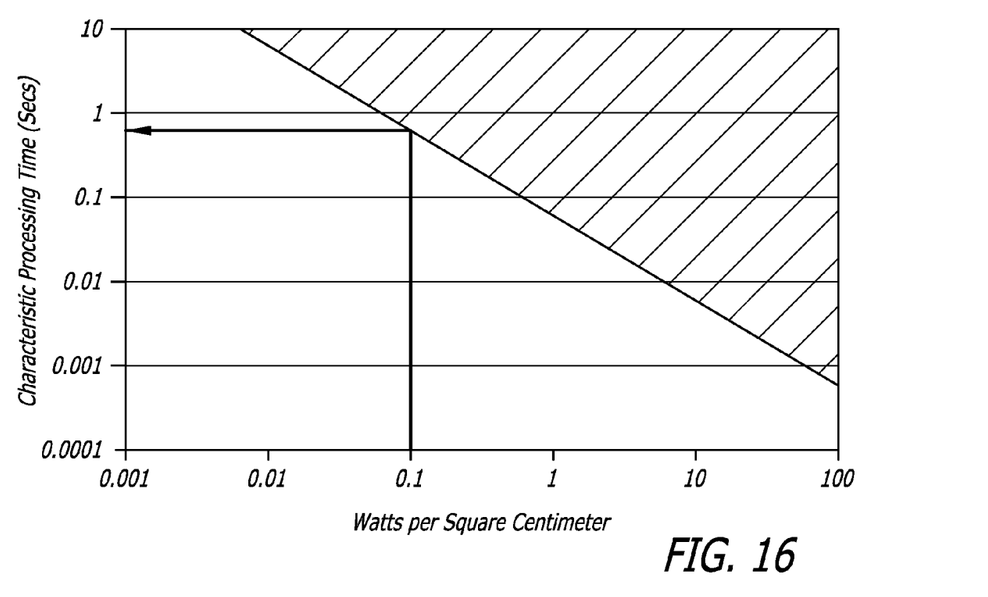
FIG. 16 shows a graphical representation of a characteristic processing time for metal whiskers in relation to the power of the applied electromagnetic radiation.

As for the amount of energy needed to process any whiskers that have accumulated, FIG. 15 illustrates the equation for calculating a characteristic processing time of the whiskers, wherein: $P_w$=whisker heating power; $T_m$=melting temperature of tin; $c_h$=specific heat of tin; $c_f$=heat of fusion of tin; $\rho_m$=density of tin; $\rho_r$=resistivity of tin; $P_0$=THz power out; $Z_0$=free space impedance; and G=THz antenna gain. Additionally, FIG. 16 graphically represents the characteristic processing time or "melt" time, in seconds, as a function of RF power, in watts per square centimeter. This graphical illustration is presented to serve as an exemplary guideline for setting RF power and exposure time parameters, while other levels of power and time requirements may also be contemplated as known by one of ordinary skill in the art.

Figure 17:
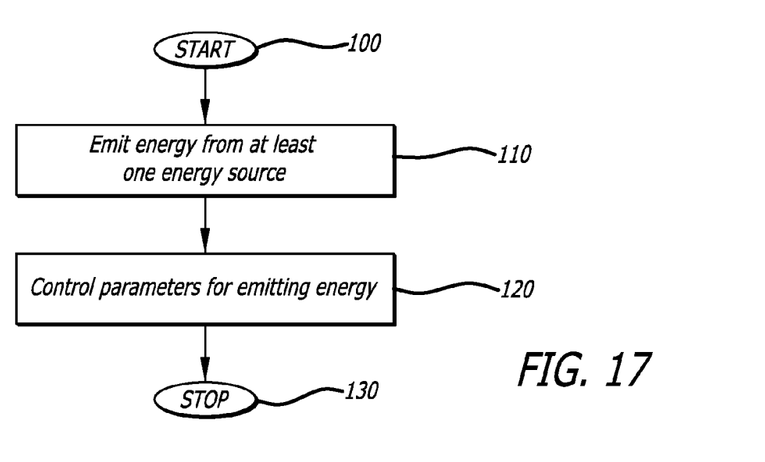
FIG. 17 is a block diagram of a method of emitting electromagnetic energy to reduce the occurrence of metal whiskers.

A summary of the process of emitting RF energy to reduce the occurrence of metal whiskers is provided in FIG. 17. The process is started (block 100), and electromagnetic energy is emitted from at least one source via a radiation field wherein an electronic component with a whiskering metal is positioned (block 110). The parameters associated with the emission of electromagnetic energy, such as the frequency and the amplitude of the electromagnetic energy, as well as the duration of its emission, are then controlled to reduce the occurrence of metal whiskers on a metal surface (block 120). For example, the use of a broadband mix of frequencies (wavelengths from about 1 mm down to about 1-10 microns) with a power emphasis at wavelengths near 1-10 microns would cause resonance in budding whiskers. In one aspect, one may use a range of wavelengths from about 1 micron to about 10 microns at one power level, in parallel with a range of wavelengths from about 10 microns to about 1 mm at another power level. The power levels may be less than 1 Watt per square centimeter for long duration exposure (i.e. any exposure that has a total duty cycle of more than a few percent). The power level for a short duration exposure may be very high, up to 100 Watts per square centimeter or more. A short duration exposure may be 1 microsecond to 1 millisecond in duration, and a long duration exposure may be hours or days in duration. The process may then be ended (block 130).

Notably, while apparatus and methods for reducing the occurrence of metal whiskers have been primarily been described in reference to electronic solder joints, the use of emitting RF energy toward metal surfaces to reduce the occurrence of metal whiskers may be used in other applications. For example, RF emitters such as those described above may be used in vehicles, aerospace equipment (e.g., critical systems such as embedded computers used for navigation, engine control, and direction as well as orientation controls, radios, transponders, and pointing and tracking electronics), communications systems, and other applications to emit RF energy to reduce the occurrence of metal whiskers in such applications.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

I claim:

1. A method of reducing formation of metal whiskers on a surface including a whiskering metal, the method comprising:
   causing an emission of an electromagnetic energy from at least one electromagnetic energy source to create a radiation field in which the whiskering metal is positioned; and
   controlling parameters associated with the emission of the electromagnetic energy, the parameters comprising a frequency, an amplitude, and a power level of electromagnetic energy, and a duration of the emission,
   wherein the at least one electromagnetic energy source is coupled to a circuit board.

2. The method of claim 1, wherein the electromagnetic energy is radiofrequency energy.

3. The method of claim 1, wherein the at least one electromagnetic energy source is a terahertz emitter.

4. The method of claim 3, wherein the terahertz emitter comprises a horn antenna.

5. The method of claim 3, wherein the terahertz emitter comprises a quantum cascade laser.

6. The method of claim 3, wherein the terahertz emitter comprises a cooler.

7. The method of claim 3, wherein the at least one electromagnetic energy source is embedded within an electronic component that receives electromagnetic energy from the terahertz emitter.

8. The method of claim 1, wherein controlling parameters for emitting electromagnetic energy further comprises controlling the at least one electromagnetic energy source to emit electromagnetic energy continuously.

9. The method of claim 1, wherein controlling parameters for emitting electromagnetic energy further comprises controlling the at least one electromagnetic energy source to emit electromagnetic energy according to a periodic schedule.

10. The method of claim 1, wherein controlling parameters for emitting electromagnetic energy further comprises controlling the at least one electromagnetic energy source to emit electromagnetic energy of about one watt of terahertz power.

11. The method of claim 1, wherein controlling parameters for emitting electromagnetic energy further comprises controlling the at least one electromagnetic energy source to emit electromagnetic energy at a single frequency.

12. The method of claim 1, wherein controlling parameters for emitting electromagnetic energy further comprises controlling the at least one electromagnetic energy source to emit electromagnetic energy at a discrete set of frequencies.

13. An apparatus for applying electromagnetic energy to a housing, the apparatus comprising:
   at least one electromagnetic energy source positioned to provide the electromagnetic energy to the housing containing electronic components including a whiskering metal; and
   a controller for controlling emission of electromagnetic energy from the at least one electromagnetic energy source, wherein the emission is based on parameters comprising a frequency, an amplitude, and a power level of the electromagnetic energy, and a duration of the emission,
   wherein the at least one electromagnetic energy source is coupled to a circuit board.

14. The apparatus of claim 13, wherein the electromagnetic energy is radiofrequency energy.

15. The apparatus of claim 13, wherein the at least one electromagnetic energy source is a terahertz emitter.

16. The apparatus of claim 15, wherein the terahertz emitter comprises a horn antenna.

17. The apparatus of claim 15, wherein the terahertz emitter comprises a quantum cascade laser.

18. The apparatus of claim 15, wherein the terahertz emitter comprises a cooler.

19. The apparatus of claim 13, wherein the at least one electromagnetic energy source comprises multiple electromagnetic energy sources coupled to circuit board cards associated with the circuit board.

20. An apparatus for mitigating formation of metal whiskers on a surface containing a whiskering metal, the apparatus comprising:
   at least one electromagnetic energy source configured to provide emission of electromagnetic energy to the surface; and
   means for controlling parameters of the electromagnetic energy emitted from the at least one electromagnetic energy source; the parameters comprising a frequency, an amplitude, and a power level of the electromagnetic energy, and a duration of the emission,
   wherein the at least one electromagnetic energy source is coupled to a circuit board.

* * * * *